United States Patent [19]
Opris

[11] Patent Number: 5,861,828
[45] Date of Patent: Jan. 19, 1999

[54] APPARATUS AND METHOD FOR MONOTONIC DIGITAL CALIBRATION OF A PIPELINE ANALOG-TO-DIGITAL CONVERTER

[75] Inventor: Ion E. Opris, Cupertino, Calif.

[73] Assignee: National Semiconductor Corporation, Santa Clara, Calif.

[21] Appl. No.: 949,487

[22] Filed: Oct. 14, 1997

[51] Int. Cl.$^6$ .................................................. H03M 1/10
[52] U.S. Cl. ........................................... 341/120; 341/161
[58] Field of Search .................................. 341/120, 118, 341/119, 144, 155, 161, 162

[56] References Cited

U.S. PATENT DOCUMENTS

| | | | |
|---|---|---|---|
| 4,947,168 | 8/1990 | Myers | 341/120 |
| 5,266,951 | 11/1993 | Kuegler et al. | 341/120 |
| 5,327,129 | 7/1994 | Soenen et al. | 341/120 |
| 5,331,321 | 7/1994 | Mannonen | 341/110 |
| 5,361,067 | 11/1994 | Pinckley | 341/120 |

OTHER PUBLICATIONS

Seung–Hoon Lee and Bang–Sup Song, "Digital–Domain Calibration of Multistep Analog–to–Digital Converters", IEEE Journal of Solid–State Circuits, vol. 27, No. 12, Dec. 1992, pp. 1679–1688.

Eric G. Soenen and Randall L. Geiger, "An Architecture and An Algorithm for Fully Digital Correction of Monolithic Pipelined ADC's", IEEE Transactions on Circuits and Systems–II: Analog and Digital Signal Processing, vol. 42, No. 3, Mar. 1995, pp. 143–153.

Andrew N. Karanicolas, Hae–Seung Lee and Kantilal L. Bacrania, "A 15–b 1–Msample/s Digitally Self–Calibrated Pipelined ADC", IEEE Journal of Solid–State Circuits, vol. 28, No. 12, Dec. 1993, pp. 1207–1215.

*Primary Examiner*—Brian Young
*Attorney, Agent, or Firm*—Limbach & Limbach L.L.P.

[57] ABSTRACT

A method and circuit for performing a monotonic digital calibration of a pipeline analog-to-digital (A/D) converter calibrates each stage of the pipeline A/D converter while using the actual input A/D converter of the stage then being calibrated. The digital output from the stage is converted to an analog signal (e.g., integrated) and fed back for use as the analog input to the stage. This ensures that the digital output from the stage has a symmetrical waveform and that the analog input voltage to the stage remains at the input threshold level. The remaining downstream pipeline A/D converter stages are then used to measure the levels of the binary residue voltage corresponding to the two states of the binary stage output so that appropriate calibration data can be generated and stored for use in calibrating that stage. By repeating this process for each successive upstream pipeline A/D converter stage the entire pipeline A/D converter can be calibrated to help ensure the monotonicity of its A/D conversion.

14 Claims, 3 Drawing Sheets

APPARATUS AND METHOD FOR MONOTONIC DIGITAL CALIBRATION OF A PIPELINE ANALOG-TO-DIGITAL CONVERTER

BACKGROUND OF THE INVENTION

1. Field of the Invention

The present invention relates to pipeline analog-to-digital (A/D) converters, and in particular, to digital calibration techniques for such converters.

2. Description of the Related Art

Referring to FIG. 1, a typical stage 10 of a conventional pipeline A/D converter includes a sample and hold circuit 12, an A/D conversion circuit 14, a digital-to-analog (D/A) conversion circuit 16, a signal combining circuit 18 and an output buffer amplifier 20, all interconnected substantially as shown. By connecting N such stages 10 serially together a pipeline A/D converter is formed. A clock signal 9 synchronizes the operations of the sample and hold circuit 12, A/D converter 14 and D/A converter 16.

The analog residue signal 11 from the immediate upstream stage (i+1) is sampled and held by the sample and hold circuit 12. This analog sample voltage 13 is converted to a digital signal 15 ($D_i$) by the A/D converter 14. This digital signal 15 is provided as the binary bit information for that stage (i) and is also converted back to an analog signal by the D/A converter 16. This analog signal 17 is summed with the original analog sample voltage 13. The resulting sum voltage 19 is then buffered by the output amplifier 20 to provide the residue voltage signal 21 for that stage 10. (A typical voltage gain for the output amplifier 20 is two.)

Referring to FIG. 2A, the A/D converter 14 can be implemented with a voltage comparator 14a which compares the sample voltage 13 to a reference voltage 13r. Referring to FIG. 2B, the D/A converter 16 can be implemented with a latching multiplexor 16a which, in accordance with the digital signal 15, selects between negative 15n and positive 15p analog voltages which are equal in magnitude for outputting as the analog voltage 17 to be summed with the sample voltage 13.

Such analog processing stages for pipeline A/D converters (often referred to as algorithmic A/D converters) have inherent imperfections which negatively affect the linearity and, therefore, the accuracy of such converters. For example, the number of linearity bits is determined by the native matching of the passive components and is usually limited to eight or ten bits. While it is possible to provide various forms of trimming of the analog circuitry which have been proven to work up to 16 bits of accuracy, such trimming procedures are very difficult and expensive.

Accordingly, a commonly used alternative approach is that of digital calibration and correction. In such an approach, the errors attributed to the analog components are identified and compensated within the digital domain. Examples of the techniques used in this approach can be found in the following references: S-H. Lee and B-S. Song, "Digital-Domain Calibration of Multistep Analog-to-Digital Converters," IEEE Journal of Solid-State Circuits, Vol. 27, No. 12, December 1992, pp. 1679–88; and A. N. Karanicolas, H-S. Lee and K. L. Bacrania, "A 15-b 1-Msample/s Digitally Self-Calibrated Pipeline ADC," IEEE Journal of Solid-State Circuits, Vol. 28, No. 12, December 1993, pp. 1207–15; the disclosures of which are incorporated herein by reference.

A major concern about such digital calibration and correction algorithms is that of the monotonicity of the transfer function. It has been shown that any linear correction algorithm with multiple internal representations of the same output code cannot guarantee the monotonicity of a converter transfer function. It has also been shown that local discontinuities in the monotonicity can occur within the output code even after digital correction.

Whereas the presence of a few signal states where the monotonicity has a local discontinuity may be acceptable in some applications, many closed loop control systems require virtually absolute monotonicity in order to avoid limit cycles. Further, local discontinuities in the monotonicity tend to be very difficult to detect by testing, can propagate toward the most significant bit and cannot be avoided by truncation since their positions are not known in advance.

As is well known, a common conventional digital calibration and correction technique involves the digital calibration of all of the transitions within the residue signal transfer characteristics. An analog input signal equal to the transition voltage is applied at the input of each stage and a decision is forced on both sides of such transition voltage. The resulting analog residue voltage is then measured by the remaining stages within the pipeline (assumed to be already calibrated or ideal). Based upon such measurements, correction coefficients for each transition are then stored in memory. Accordingly, each calibration step is equivalent to performing a digital shift of all of the residue segments along a common line (the ideal linear transfer characteristic).

Initially such a calibration algorithm may appear to preserve overall monotonicity since each step in the calibration procedure is monotonic. Indeed, this may be true if the analog calibration voltages are precisely at the exact voltage transition points. However, due to different offsets in the individual voltage comparator circuits, the actual transition points are offset, or shifted, from their ideal position. These offsets in the transition point, when combined with the inherent gain errors, lead to a calibrated transition which is not precisely equal to the actual transition gap. Therefore, the overall transfer characteristic has discontinuities in its monotonicity.

Accordingly, it would be desirable to have a digital calibration algorithm which truly preserves overall monotonicity of its transfer characteristic.

SUMMARY OF THE INVENTION

An apparatus and method for monotonic digital calibration of a pipeline A/D converter in accordance with the present invention forces an analog input voltage at each calibrated stage which is precisely at the exact voltage transition point for that particular stage. During calibration of each stage, the actual input voltage comparator is used in determining the analog input value for the corresponding transition calibration.

In accordance with one embodiment of the present invention, a method of performing a monotonic digital calibration of one or more stages of a pipeline analog-to-digital (A/D) converter includes the steps of: receiving and converting in one of the multiple stages of a pipeline A/D converter an analog feedback signal to a digital signal which includes first and second digital signal states; converting the digital signal to the analog feedback signal, such that the analog feedback signal is maintained within a range of values for which the digital signal is in the first and second digital signal states for approximately equal periods of time; and generating, in accordance with the analog feedback signal in the one stage of the pipeline A/D converter, a residue signal which includes first and second signal levels which correspond to the first and second digital signal states, respectively.

In accordance with another embodiment of the present invention, a pipeline analog-to-digital (A/D) converter with a monotonic digital calibration circuit includes a pipeline A/D converter and a feedback digital-to-analog (D/A) conversion circuit. Each of the multiple stages of the pipeline A/D converter includes an A/D conversion circuit, an input D/A conversion circuit and a signal combining circuit. The A/D conversion circuit is configured to receive and convert an analog feedback signal to a digital signal which includes first and second digital signal states. The input D/A conversion circuit is coupled to the A/D conversion circuit and is configured to receive the digital signal and in accordance therewith provide an analog conversion signal which includes first and second conversion signal states which correspond to the first and second digital signal states, respectively. The signal combining circuit is coupled to the A/D and input D/A conversion circuits and is configured to receive and combine the analog feedback signal and the analog conversion signal and in accordance therewith provide a residue signal which includes first and second signal levels which correspond to the first and second digital signal states, respectively. The feedback D/A conversion circuit is selectively coupled to one of the plurality of pipeline A/D converter stages and is configured to receive and convert the digital signal to the analog feedback signal. The analog feedback signal is maintained within a range of values for which the digital signal is in the first and second digital signal states for approximately equal periods of time.

These and other features and advantages of the present invention will be understood upon consideration of the following detailed description of the invention and the accompanying drawings.

DETAILED DESCRIPTION OF THE INVENTION

Figure 1:
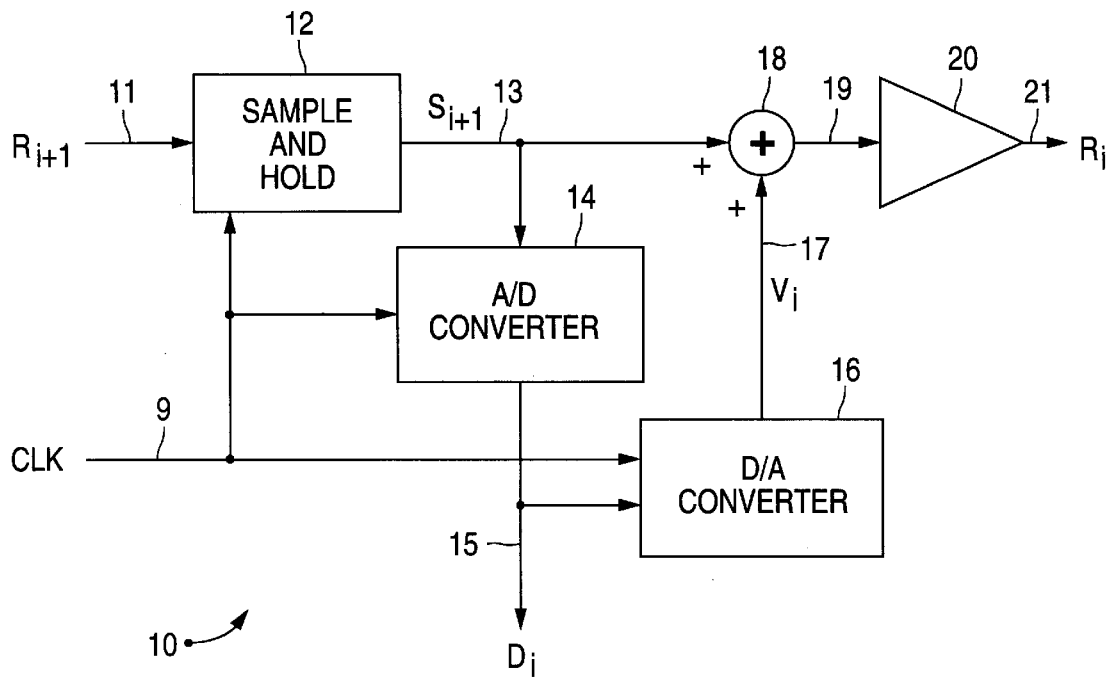
FIG. 1 is a functional block diagram of a conventional stage for a pipeline A/D converter.
Figure 2A:
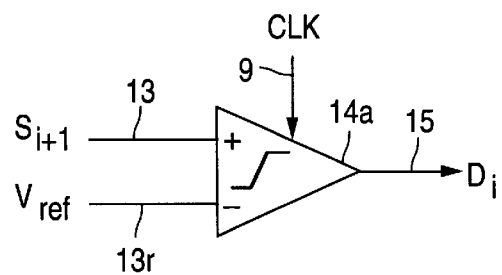
FIG. 2A is a functional block diagram of a conventional voltage comparator used as an A/D converter.
Figure 2B:
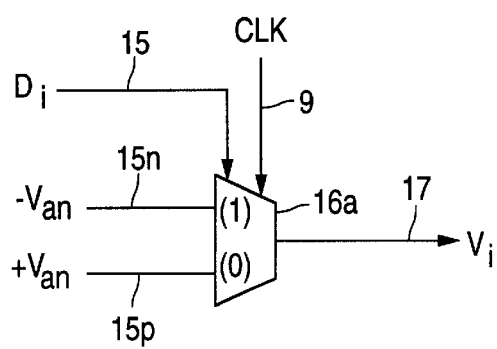
FIG. 2B is a functional block diagram of a conventional multiplexor used as a D/A converter.
Figure 3:
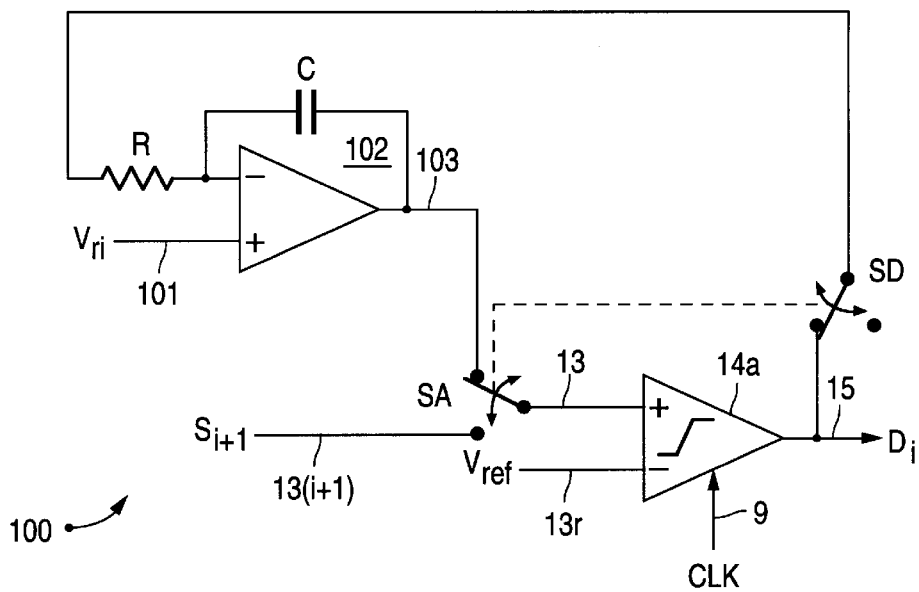
FIG. 3 is a schematic diagram of a circuit in which an integrated feedback voltage is used for performing a monotonic digital calibration of one stage of a pipeline A/D converter using the corresponding input A/D conversion circuit in accordance with one embodiment of the present invention.

Referring to FIG. 3, a circuit 100 for performing monotonic digital calibration of one stage of a pipeline A/D converter in accordance with one embodiment of the present invention includes the voltage comparator 14a of the stage 10 to be calibrated (FIG. 1) and a feedback digital-to-analog conversion circuit 102 in the form of a continuous time voltage integration circuit interconnected by way of two signal routing circuits such as switches SA, SD substantially as shown.

The switches SA/SD operate in unison such that when operating in the calibration mode the digital output 15 from the voltage comparator 14a is fed back and converted to an analog signal 103, e.g., via integration of the digital signal 15. The voltage integration circuit 102 integrates the digital signal 15 based upon an input integration voltage reference 101. The resulting feedback loop ensures that the average duty cycle for the voltage comparator 14a output signal 15 is 50%. In turn, this ensures that the analog input voltage 13 of the comparator 14a is exactly at the voltage transition, or threshold, value. (The values for the resistor R and capacitor C in the integration circuit 102 can be selected based upon the desired settling time and tolerable noise in the resulting analog voltage 103.)

Other forms of D/A conversion circuits can be used in place of the continuous time integration circuit 102. For example, other possible implementations include a switched-capacitor filter or a combination of a digital filter with a low resolution D/A converter (e.g. an 8-bit D/A converter would cover a voltage range of −25 through +25 millivolts with steps of 200 microvolts). One advantage of the filter and D/A converter combination is that the analog input voltage can be held constant during the calibration cycle with increased noise immunity.

Figure 4:
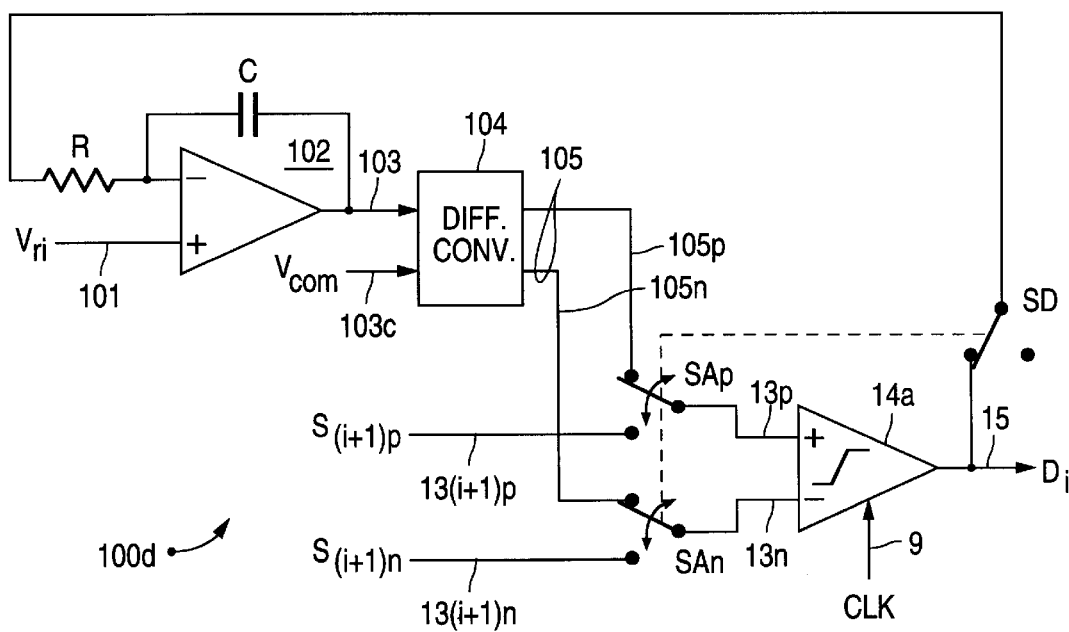
FIG. 4 is a schematic diagram of a differential implementation of the circuit of FIG. 3.

Referring to FIG. 4, a differential implementation 100d can be formed by using a pair of input signal routing circuits SAp, SAn and a differential conversion circuit 104, connected substantially as shown. The single-ended analog voltage 103 is converted to a differential voltage 105 (with positive 105p and negative 105n signal phases) based upon an input voltage reference 103c. As with the single-ended configuration of FIG. 3, the switches SAp, SAn, SD operate in unison to form a feedback loop during calibration such that the single-ended digital output signal 15 is converted to a differential analog voltage 105 with a value which is maintained at the value of the transition, or threshold, voltage of the comparator 14a.

Figure 5:
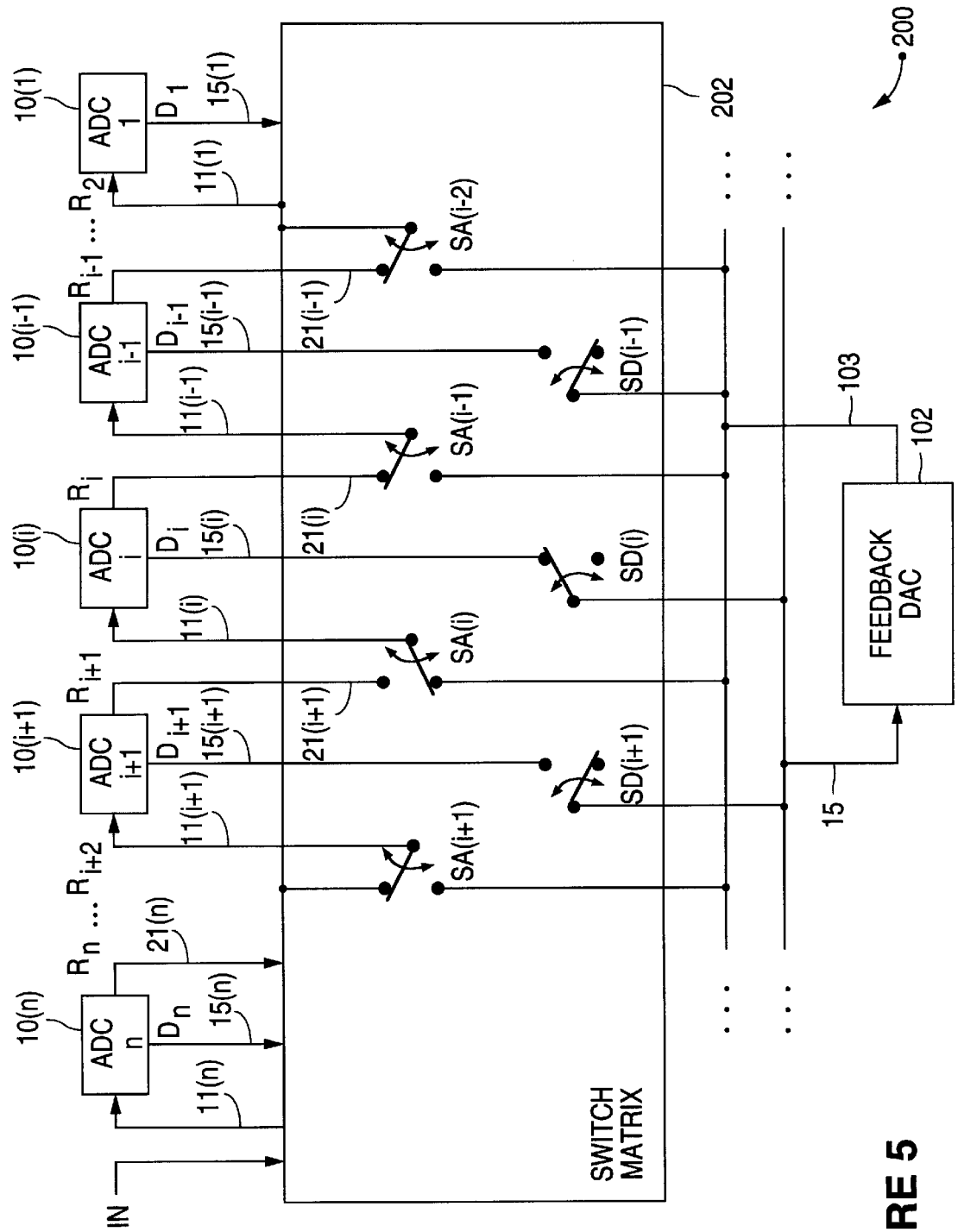
FIG. 5 is a functional block diagram of a pipeline A/D converter with circuitry for performing monotonic digital calibration in accordance with another embodiment of the present invention.

Referring to FIG. 5, for calibrating each individual stage 10 of a pipeline A/D converter, the feedback D/A converter 102 can be switched, or multiplexed, among the stages 10 individually using a switch matrix 202. For example, for calibrating stage i 10(i) of the pipeline A/D converter switch SD(i) connects the digital output 15(i) of stage i to the input of the feedback D/A converter 102 while switch SA(i) connects the output of the feedback D/A converter 102 to the input of stage i. The switches for the remaining downstream stages i-1, i-2, ..., 1 are positioned so as to maintain normal operation of such stages. Accordingly, the downstream stages i-1, i-2, ..., 1 are used during the calibration process in accordance with well known conventional techniques. This process is repeated for each of the remaining upstream stages n, n-1, ..., i+1 following which the pipeline A/D converter has been digitally calibrated for overall monotonicity.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of performing a monotonic digital calibration of one or more stages of a pipeline analog-to-digital (A/D) converter, said method comprising the steps of:

(a) receiving and converting in one of a plurality of stages of a pipeline A/D converter an analog feedback signal to a digital signal which includes first and second digital signal states;

(b) converting said digital signal to said analog feedback signal, wherein said analog feedback signal is maintained within a range of values for which said digital signal is in said first and second digital signal states for approximately equal periods of time, and wherein said analog feedback signal varies within said range of values in first and second continuously monotonic relations which are between and opposite in polarity to preceding transitions of said digital signal between said first and second digital signal states; and (c) generating, in accordance with said analog feedback signal in said one of said plurality of stages of said pipeline A/D converter, a residue signal which includes first and second signal levels which correspond to said first and second digital signal states, respectively.

2. The method of claim 1, wherein said step (a) comprises receiving and converting an analog feedback voltage to a digital voltage with a voltage comparison circuit.

3. The method of claim 1, wherein said step (b) comprises integrating a digital voltage and in accordance therewith generating an analog integration voltage with a voltage integration circuit.

4. The method of claim 1, wherein said step (c) comprises generating said residue signal by summing said analog feedback signal with a summation signal which includes first and second summation signal states which correspond to said first and second digital signal states, respectively.

5. The method of claim 1, further comprising the step of repeating the steps of claim 1 successively for each remaining upstream one of said plurality of pipeline A/D converter stages.

6. The method of claim 1, further comprising the step of measuring said first and second residue signal levels with one or more remaining downstream ones of said plurality of stages of said pipeline A/D converter and in accordance therewith generating A/D conversion calibration data corresponding to said one of said plurality of stages of said pipeline A/D converter stage.

7. The method of claim 6, further comprising the step of repeating the steps of claims 1 and 6 successively for each remaining upstream one of said plurality of pipeline A/D converter stages.

8. An apparatus including a pipeline analog-to-digital (A/D) converter with a monotonic digital calibration circuit, comprising:

a pipeline A/D converter with a plurality of stages, wherein each one of said plurality of pipeline A/D converter stages includes an A/D conversion circuit configured to receive and convert an analog feedback signal to a digital signal which includes first and second digital signal states, an input digital-to-analog (D/A) conversion circuit, coupled to said A/D conversion circuit, configured to receive said digital signal and in accordance therewith provide an analog conversion signal which includes first and second conversion signal states which correspond to said first and second digital signal states, respectively, and a signal combining circuit, coupled to said A/D and input D/A conversion circuits, configured to receive and combine said analog feedback signal and said analog conversion signal and in accordance therewith provide a residue signal which includes first and second signal levels which correspond to said first and second digital signal states, respectively; and a feedback D/A conversion circuit, selectively coupled to one of said plurality of pipeline A/D converter stages, configured to receive and convert said digital signal to said analog feedback signal, wherein said analog feedback signal is maintained within a range of values for which said digital signal is in said first and second digital signal states for approximately equal periods of time, and wherein said analog feedback signal varies within said range of values in first and second continuously monotonic relations which are between and opposite in polarity to preceding transitions of said digital signal between said first and second digital signal states.

9. The apparatus of claim 8, wherein said A/D conversion circuit comprises a voltage comparison circuit.

10. The apparatus of claim 8, wherein said input D/A conversion circuit comprises a signal routing circuit configured to receive said digital signal and in accordance therewith route one of a plurality of analog voltages to said signal combining circuit as said analog conversion signal.

11. The apparatus of claim 8, wherein said signal combining circuit comprises a voltage summing circuit.

12. The apparatus of claim 8, wherein said feedback D/A conversion circuit comprises a voltage integration circuit.

13. The apparatus of claim 8, further comprising a signal routing circuit, coupled between said feedback D/A conversion circuit and each one of said plurality of pipeline A/D converter stages, configured to selectively couple said feedback D/A conversion circuit to individual ones of said plurality of pipeline A/D converter stages.

14. The apparatus of claim 13, wherein said signal switching circuit comprises a signal multiplexor circuit configured to multiplex said digital signal and said analog feedback signal between said feedback D/A conversion circuit and said individual ones of said plurality of pipeline A/D converter stages.

* * * * *